United States Patent
Liao et al.

(10) Patent No.: US 10,514,426 B2
(45) Date of Patent: Dec. 24, 2019

(54) SMART JUMPER CABLE HAVING A DISPLAY MODULE

(71) Applicant: Dong Guan Juxing Power Co., Ltd., Dongguan, Guangdong (CN)

(72) Inventors: Yuefei Liao, Guangdong (CN); Dewen Ma, Guangdong (CN)

(73) Assignee: Dong Guan Juxing Power Co., Ltd., Dongguan (CN)

(*) Notice: Subject to any disclaimer, the term of this patent is extended or adjusted under 35 U.S.C. 154(b) by 72 days.

(21) Appl. No.: 15/863,500

(22) Filed: Jan. 5, 2018

(65) Prior Publication Data
US 2019/0086477 A1 Mar. 21, 2019

(30) Foreign Application Priority Data
Sep. 20, 2017 (CN) .................... 2017 2 1206397 U

(51) Int. Cl.
| | | |
|---|---|---|
| *H02J 7/00* | (2006.01) | |
| *G01R 31/388* | (2019.01) | |
| *H01R 4/48* | (2006.01) | |
| *G01R 31/371* | (2019.01) | |
| *G01R 31/392* | (2019.01) | |
| *H02J 1/06* | (2006.01) | |
| *H01R 11/24* | (2006.01) | |
| *H02J 1/00* | (2006.01) | |

(52) U.S. Cl.
CPC ......... *G01R 31/388* (2019.01); *G01R 31/371* (2019.01); *G01R 31/392* (2019.01); *H01R 4/48* (2013.01); *H02J 1/06* (2013.01); *H02J 7/0047* (2013.01); *H02J 7/0052* (2013.01); *H02J 7/0054* (2013.01); *H01R 11/24* (2013.01); *H02J 2001/006* (2013.01); *H02J 2007/005* (2013.01); *H02J 2007/0037* (2013.01)

(58) Field of Classification Search
CPC .. G01R 31/388; G01R 31/392; G01R 31/371; H01R 4/48; H02J 7/0047; H02J 7/0052
USPC ...................................... 320/103, 104, 107
See application file for complete search history.

(56) References Cited

U.S. PATENT DOCUMENTS

2010/0301800 A1* 12/2010 Inskeep ................ H01M 10/48
320/105
2017/0346140 A1* 11/2017 Koebler ............. H01M 10/425

* cited by examiner

*Primary Examiner* — Zixuan Zhou

(57) ABSTRACT

The present disclosure provides a smart jumper cable having a display module, which comprises a pair of clamps and a control module. The clamps are configured to electrically connect to a vehicle battery; the control module is electrically connected with the clamps through electric wires; the control module further comprises an input port for connecting with an external power supply. The control module comprises a MCU, a switch module and a display module; wherein the display module is electrically connected with the MCU. The switch module is configured to turn on/off the power-supply to the vehicle battery from the external power supply; and the switch module is controlled by the MCU. The smart jumper cable having a display module can display not only the load voltage but also some other working status visually.

8 Claims, 3 Drawing Sheets

SMART JUMPER CABLE HAVING A DISPLAY MODULE

TECHNICAL FIELD

This disclosure relates to a smart jumper cable having a display module.

BACKGROUND

Typical jumper cables used in vehicles for emergency start only act as power switches to turn on/off the power supply, and are therefore of function singleness. In addition, none of the conventional jumper cables includes a display module. As a result, there is a case that the vehicle battery is in a good condition and the vehicle battery is able to still work well, but the conventional jumper cables cannot identify the actual status. Accordingly, there is a desire in the art to design an improved jumper cable.

SUMMARY

This disclosure aims to provide a smart jumper cable having a display module, wherein said smart jumper cable is capable of displaying the electrical parameters visually with a novel design.

The technical solution is achieved as follows.

A smart jumper cable having a display module, comprising a pair of clamps and a control module; wherein said clamps are configured to electrically connect to a vehicle battery, wherein said control module is electrically connected with said clamps through electric wires; said control module further comprises an input port for connecting with an external power supply, wherein said control module further comprises a MCU, a switch module and a display module; wherein said display module is electrically connected with said MCU; said switch module is configured to turn on/off power-supply to said vehicle battery from said external power supply; and said switch module is controlled by said MCU.

Preferably, said switch module includes at least one power switch electrically connected in series between said input port and said clamps, wherein said power switch comprising a MOS transistor, or a relay, or an IGBT.

Preferably, said switch module includes two switch units electrically connected in series; each of said switch units comprises three MOS transistors electrically connected in parallel.

Preferably, said smart jumper cable having a display module further comprises a voltage detection circuit for detecting the voltage of said vehicle battery or the voltage of said external power supply; wherein said display module is configured to display a voltage value detected by said voltage detection circuit.

Preferably, said voltage detection circuit includes resistors R10 and R17; one end of said resistor R10 is electrically connected to a first clamp of said clamps; said first clamp is configured to electrically connect to a positive electrode of said vehicle battery, and an other end of said resistor R10 is grounded through said resistor R17.

Preferably, a connection point of said resistors R10 and R17 is directly connected to an analog signal input end of said MCU; or said connection point of said resistors R10 and R17 is electrically connected to said analog signal input end (more particularly, AN0 end. The signal received by said analog signal input end will be A/D converted within the MCU) of said MCU through a resistor R5.

Preferably, said display module comprises a nixie tube module.

Preferably, said nixie tube module is a three-digit nixie tube (i.e. which can display three valid decimal digits, with decimal point if necessary).

Preferably, said display module comprises an LCD screen.

Preferably, said MCU comprises at least one A/D port.

Preferably, said MCU is the NTMP2012.

Said NTMP2012 is a chip with a charging management module, a power detection and LED indicator module, and a boost-discharge management module integrated therein, which completely replace the charging management IC solution in the current market. The product is packaged as 16NSOP/20SSOP. The use of the NTMP2012 improves the stability of the charging circuit and reduces the cost.

Beneficial Effects

The present disclosure provides a smart jumper cable having a display module. The display module is used to display the voltage of a vehicle battery. Therefore, if the voltage is indicated as normal, users will understand the vehicle battery is working well in advance without having to output electrical energy by said smart jumper cable. Accordingly, the smart jumper cable according to the present disclosure is significantly advantageous over the conventional battery charger jumper cables.

DETAILED DESCRIPTION

Hereinafter, this disclosure will be described in detail in combination with the embodiments and drawings for better understanding the objective, technical solutions and advantages of the present disclosure.

Embodiment 1

Figure 1:
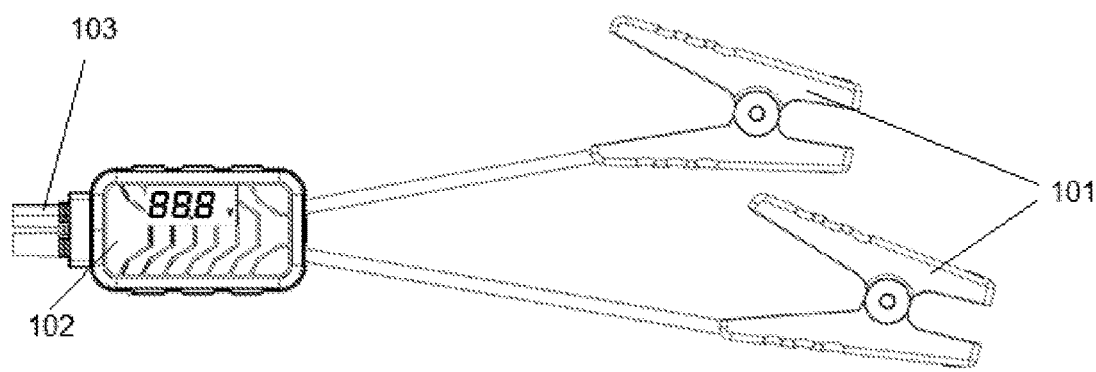
FIG. 1 is an overall schematic diagram of the smart jumper cable with a display module according to the present disclosure.

Referring to FIG. 1, a smart jumper cable having a display module comprises a pair of clamps 101 and a control module 102; wherein the clamps 101 are configured to electrically connect to a vehicle battery.

The control module 102 is electrically connected with the clamps 101 through electric wires; the control module 102 further comprises an input port 103 for connecting with an external power supply.

Figure 2:
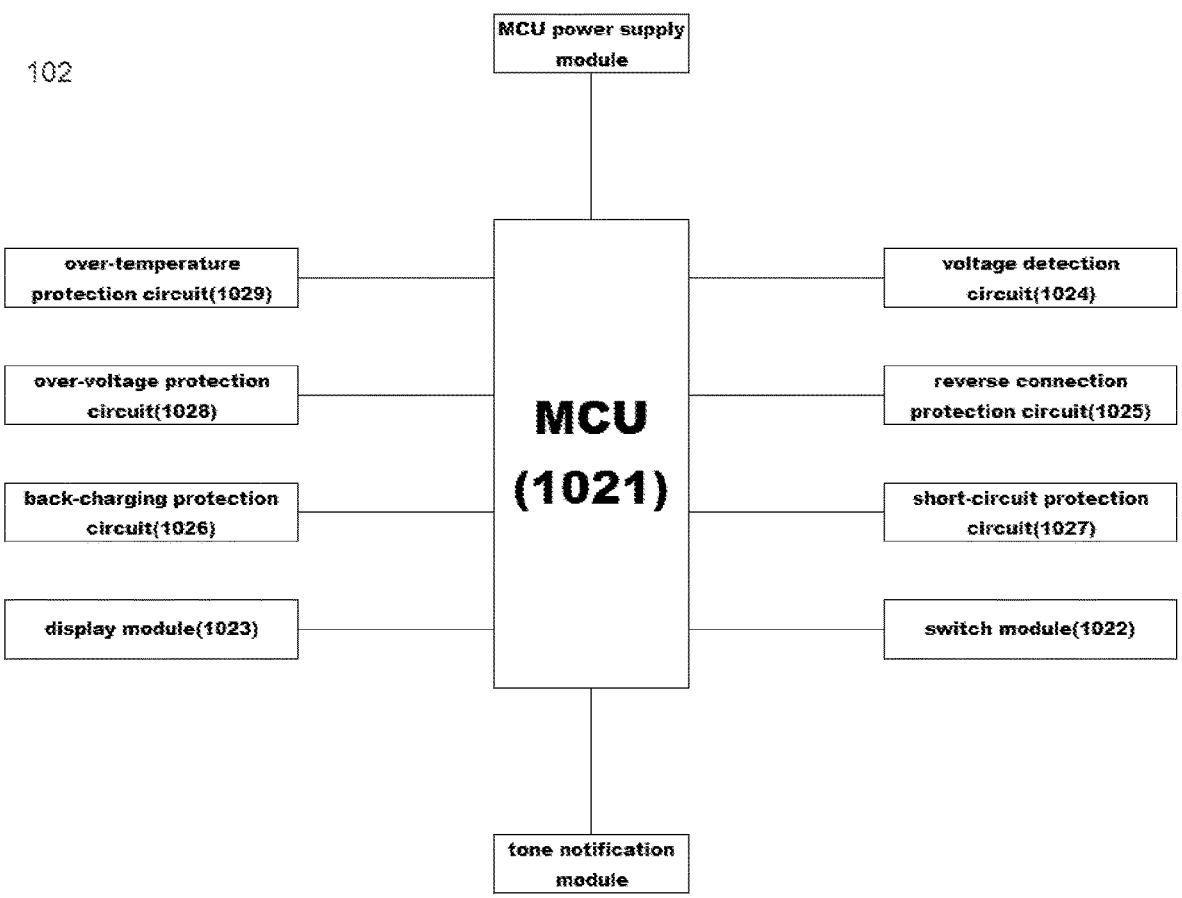
FIG. 2 is a schematic diagram of the circuit used in the smart jumper cable according to the present disclosure.
Figure 3:
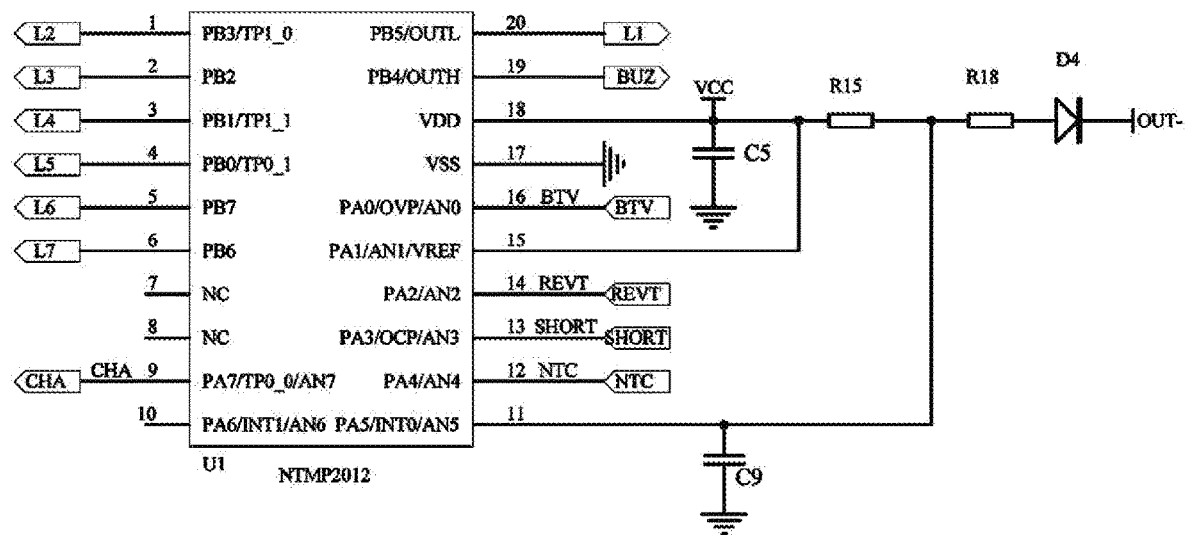
FIG. 3 is a schematic diagram of a MCU module.

Referring to FIGS. 2-3, the control module 102 includes a MCU 1021, a switch module 1022 and a display module 1023. The display module 1023 is electrically connected with the MCU 1021. The switch module 1022 is configured to turn on/off the power supply to the vehicle battery from the external power supply; and the switch module 1022 is controlled by the MCU 1021.

Figure 4:
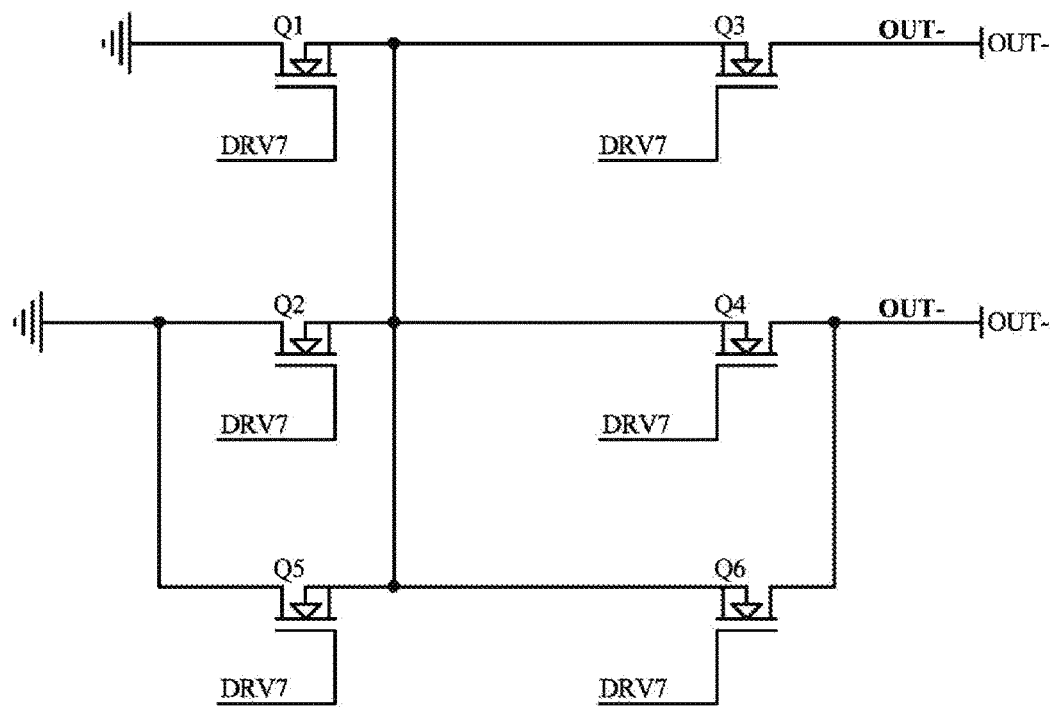
FIG. 4 is a schematic diagram of a switch module.

Referring to FIG. 4, the switch module 1022 includes two switch units electrically connected in series; each of the switch units comprises three MOS transistors electrically connected in parallel. The phase "connected in parallel" means that N terminals of two MOS transistors are short-circuited, and the G terminals of two MOS transistors are short-circuited.

Figure 6:
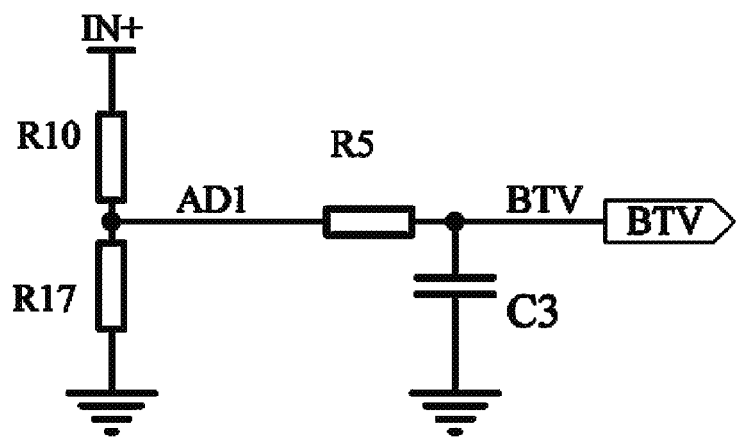
FIG. 6 is a schematic diagram of a voltage detection module.

Referring to FIG. 6, the smart jumper cable having a display module 1023 further comprises a voltage detection circuit 1024 for detecting the voltage of the vehicle battery or the voltage of the external power supply. The display module 1023 is configured to display the voltage value detected by the voltage detection circuit 1024, that is, the voltage of the vehicle battery.

The voltage detection circuit for detecting the voltage of the vehicle battery includes resistors R10 and R17. One end of the resistor R10 is electrically connected to a first clamp of the two clamps; the first clamp is configured to electrically connect to the positive electrode of the vehicle battery, and the other end of the resistor R10 is grounded through the resistor R17.

A connection point of the resistors R10 and R17 is directly electrically connected to an analog signal input end of the MCU 1021. Alternatively, the connection point of the resistors R10 and R17 is electrically connected to the analog signal input end (more particularly, AN0 end, see FIG. 3. The signal received by the analog signal input end will be A/D converted within the MCU 1021) of the MCU 1021 through a resistor R5.

The voltage detection circuit for detecting the external power supply may be identical to the voltage detection circuit for detecting the voltage of the vehicle battery. That is, the voltage may be detected by dividing resistor. In this manner, the signal is output to another A/D port of the MCU 1021.

Figure 5:
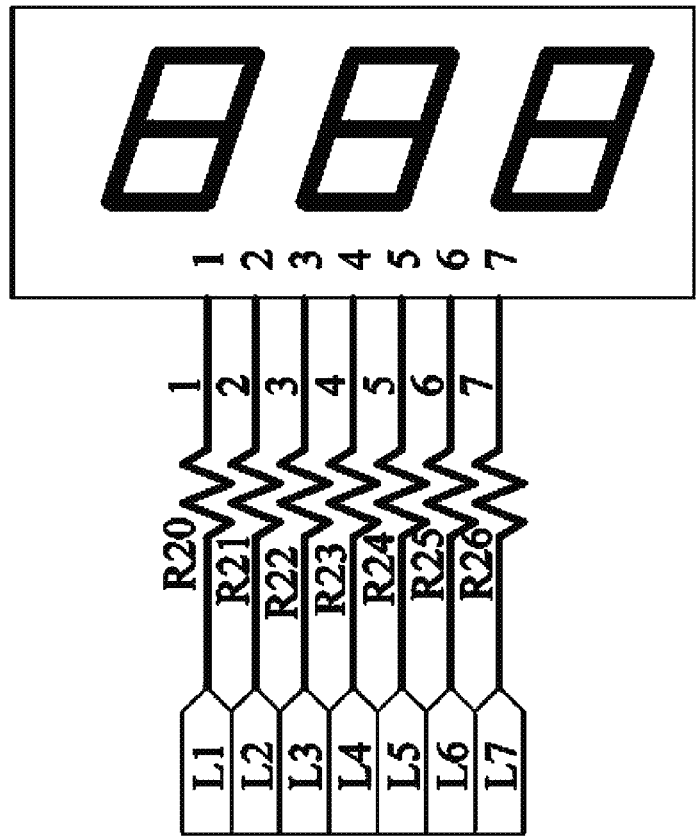
FIG. 5 is a schematic diagram of a display module.

Referring to FIG. 5, the display module 1023 comprises a nixie tube module. In this embodiment, the display module 1023 comprises three nixie tubes, namely, the nixie tube module is a three-digit nixie tube (i.e. which can display three valid decimal digits, with decimal point if necessary). Wherein seven ends of the display module 1023 are electrically connected to the pins 1-6 of the MCU 1021 through seven resistor R20-R26, respectively.

The MCU 1021 has at least one A/D port, and preferably has a plurality of A/D ports as shown in this embodiment. One such MCU 1021 is the NTMP2012.

As shown in FIG. 4, the OUT-port is electrically connected to a second clamp opposite to the first clamp which is electrically connected with the IN+ port. The G ends of the Six MOS transistors are electrically connected to the output end of the driver module after being short-circuited. The input end of the driver module is electrically connected to a CHA end (i.e., the pin 9 as shown in FIG. 3) of the MCU 1021.

The smart jumper cable according to the present disclosure can detect and visually display the voltage of the vehicle battery and the jump starter battery accurately, facilitating users to directly understand if the vehicle starting up failure is due to the lack of power.

The control module further comprises at least a reverse connection protection circuit 1025 to prevent the power supply connected with reverse polarity, a back-charging protection circuit 1026 to prevent the back-charging of the external power supply from the vehicle electric system, a short-circuiting protection circuit 1027 to prevent the clamps inadvertent connected to each other, and also an over-voltage protection circuit 1028 and an over-temperature protection circuit 1029 are included in the control module to protect the external power supply from being over charged. And all of the status of these functional circuits can be indicated in the display module of course, these status can be alarmed by a tone notification module as well.

What is claimed is:

1. A smart jumper cable having a display module, said jumper cable comprising: a pair of clamps and a control module; wherein said clamps are configured to electrically connect to a vehicle battery;

wherein said control module is electrically connected with said clamps through electric wires; said control module further comprises an input port for connecting with an external power supply; and wherein said control module further comprises a micro-control unit (MCU), a switch module and a display module; wherein said display module is electrically connected with said MCU; said switch module is configured to turn on/off power supply to the vehicle battery from said external power supply; and said switch module is controlled by said MCU;

wherein said switch module comprises two switch units electrically connected in series; each of said switch units comprises three MOS transistors electrically connected in parallel.

2. The smart jumper cable having a display module according to claim 1, further comprising a voltage detection circuit for detecting the voltage of said vehicle battery or the voltage of said external power supply; wherein said display module is configured to display a voltage value detected by said voltage detection circuit.

3. The smart jumper cable having a display module according to claim 2, wherein said voltage detection circuit comprises resistors R10 and R17; one end of said resistor R10 is electrically connected to a first clamp of said clamps; said first clamp is configured to electrically connect to a positive electrode of said vehicle battery, and another end of said resistor R10 is grounded through said resistor R17;

a connection point of said resistors R10 and R17 is directly electrically connected to an analog signal input end of said MCU; or said connection point of said resistors R10 and R17 is electrically connected to said analog signal input end of said MCU through a resistor R5.

4. The smart jumper cable having a display module according to claim 1, wherein said display module comprises a nixie tube module.

5. The smart jumper cable having a display module according to claim 4, wherein said nixie tube module is a three-digit nixie tube.

6. The smart jumper cable having a display module according to claim 4, wherein said display module comprises an LCD screen.

7. The smart jumper cable having a display module according to claim 1, wherein said MCU comprises at least one A/D port.

8. The smart jumper cable having a display module according to claim 7, wherein said MCU is the NTMP2012.

* * * * *